United States Patent
Uto et al.

(10) Patent No.: US 9,276,163 B2
(45) Date of Patent: Mar. 1, 2016

(54) METHOD FOR MANUFACTURING SILICON-BASED SOLAR CELL

(75) Inventors: Toshihiko Uto, Settsu (JP); Takashi Kuchiyama, Settsu (JP); Daisuke Adachi, Settsu (JP); Kenji Yamamoto, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 13/879,367

(22) PCT Filed: Oct. 14, 2011

(86) PCT No.: PCT/JP2011/073640
§ 371 (c)(1),
(2), (4) Date: Apr. 12, 2013

(87) PCT Pub. No.: WO2012/050186
PCT Pub. Date: Apr. 19, 2012

(65) Prior Publication Data
US 2013/0203210 A1    Aug. 8, 2013

(30) Foreign Application Priority Data

Oct. 14, 2010  (JP) .................. 2010-231168

(51) Int. Cl.
*H01L 31/20*  (2006.01)
*H01L 31/18*  (2006.01)
*H01L 31/0747*  (2012.01)

(52) U.S. Cl.
CPC .......... *H01L 31/208* (2013.01); *H01L 31/0747* (2013.01); *H01L 31/1804* (2013.01); *Y02E 10/547* (2013.01)

(58) Field of Classification Search
None
See application file for complete search history.

(56) References Cited

U.S. PATENT DOCUMENTS 4,737,196 A * 4/1988 Yukimoto ............... 136/249
5,397,920 A * 3/1995 Tran ....................... 257/749
(Continued)

FOREIGN PATENT DOCUMENTS

JP    2002299658 A    10/2002
JP     200316857 A    1/2003
(Continued)

OTHER PUBLICATIONS

Maksimenko (Conductivity and adhesion enhancement in low-temperature processed indium tin oxide/polymer nanocomposites, Thin Solid Films, vol. 518, Issue 10, Mar. 1, 2010, p. 2910-2915).*
(Continued)

*Primary Examiner* — Charles Garber
*Assistant Examiner* — Alia Sabur
(74) *Attorney, Agent, or Firm* — Alleman Hall McCoy Russell & Tuttle LLP

(57) ABSTRACT

Disclosed is a method for manufacturing a crystalline silicon-based photoelectric conversion device having a first intrinsic silicon-based layer, a p-type silicon-based layer and a first transparent electroconductive layer, positioned in this order on one surface of a conductive single-crystal silicon substrate, and having a second intrinsic silicon-based layer, an n-type silicon-based layer and a second transparent electroconductive layer, positioned in this order on the other surface of the conductive single-crystal silicon substrate. In the present invention, a heat treatment is carried out after at least one of the transparent electroconductive layers is formed. This heat treatment is carried out at a temperature of less than 200° C. under a hydrogen-containing atmosphere.

5 Claims, 3 Drawing Sheets

(56) References Cited

U.S. PATENT DOCUMENTS

| | | | | |
|---|---|---|---|---|
| 5,677,240 | A | * | 10/1997 | Murakami ............ H01L 21/285 257/E21.16 |
| 2003/0003303 | A1 | | 1/2003 | Ohtsu et al. |
| 2006/0219292 | A1 | * | 10/2006 | Asaumi et al. ................ 136/252 |
| 2009/0194151 | A1 | * | 8/2009 | Ishikawa et al. ............. 136/252 |

FOREIGN PATENT DOCUMENTS

| | | | |
|---|---|---|---|
| JP | 2003318425 | A | 11/2003 |
| JP | 2004111551 | A | 4/2004 |
| JP | 2006310774 | A | 11/2006 |
| JP | 2007294494 | A | 11/2007 |
| JP | 2011003750 | A | 1/2011 |

OTHER PUBLICATIONS

Han. H, et al., Effect of various annealing environments on electrical and optical properties of indium tin oxide on polyethylene napthalate, J. Appl. Phys. 99, 123711 (2006).*

ISA Japanese Patent Office, International Search Report of PCT/JP2011/073640, Nov. 8, 2011, WIPO, 2 pages.

International Bureau of WIPO, International Preliminary Report on Patentability of PCT/JP2011/073640, Switzerland, May 16, 2013, 7 pages.

* cited by examiner

METHOD FOR MANUFACTURING SILICON-BASED SOLAR CELL

TECHNICAL FIELD

The invention relates to a method for manufacturing a crystalline silicon-based photoelectric conversion device having a heterojunction on a single-crystal silicon substrate surface.

BACKGROUND ART

Crystalline silicon-based solar cells using crystalline silicon substrates are high in photoelectric conversion efficiency, and thus have been widely and generally used in solar power generation systems. Among them, a crystalline silicon-based solar cell in which conductive amorphous silicon-based layers having a band gap different from that of a single-crystal silicon are formed on surfaces of the crystal silicon substrate is called a heterojunction solar cell.

Among heterojunction solar cells, a solar cell having an intrinsic amorphous silicon layer between a conductive amorphous silicon-based layer and a crystal silicon substrate is known as one embodiment of a crystalline silicon-based solar cell with a high conversion efficiency. By forming an intrinsic amorphous silicon layer between a single-crystal silicon substrate and a conductive amorphous silicon-based layer, generation of defect levels during formation of the conductive amorphous silicon-based layer can be reduced and defects present on the surface of single-crystal silicon (principally dangling bonds of silicon) can be terminated (passivated) with hydrogen. In addition, due to a presence of an intrinsic amorphous silicon layer, carrier-introduction impurities can be prevented from diffusing to the surface of single-crystal silicon at the time of forming a conductive amorphous silicon-based layer.

In the aforementioned heterojunction solar cell, a transparent electroconductive layer is formed on the surface of a conductive amorphous silicon-based layer. The transparent electroconductive layer preferably has a high optical transparency and a low resistance. As a material thereof, a transparent conductive metal oxide such as a crystalline indium tin complex oxide (ITO) is used. Generally, a collecting electrode is formed on the transparent electroconductive layer. For the collecting electrode, an Ag paste or the like is used as a material.

As a technique related to a manufacturing method of a solar cell, it is known that a heat treatment is carried out in an air atmosphere after formation of an electrode. For example, Patent Document 1 discloses that in manufacture of a solar cell using a crystalline silicon substrate, a heat treatment is carried out at 300° C. or higher and 700° C. or lower under a hydrogen atmosphere after an electroconductive paste is applied. It is reported in Patent Document 1 that since a metal oxide contained in a glass frit in the electroconductive paste is subjected to hydrogen reduction by the heat treatment, both of high bonding strength and low electrical contact resistance are achieved. With respect to a manufacture of a flexible solar cell, Patent Document 2 discloses that a transparent electrode is made less resistant by carrying out a heat treatment after formation of the electrode. Patent Document 3 discloses that when a thin-film solar cell using microcrystalline silicon as a photoelectric conversion layer and a conductivity-type layer is subjected to a heat treatment under a low-oxygen partial pressure atmosphere for one hour or more, dope impurities in the conductive microcrystalline silicon layer are activated to improve electrical characteristics.

PRIOR ART DOCUMENTS

Patent Documents

Patent Document 1: JP-A-2007-294494
Patent Document 2: JP-A-2003-318425
Patent Document 3: JP-A-2004-111551

SUMMARY OF THE INVENTION

Problems to be Solved by the Invention

Generally, in manufacture of a heterojunction solar cell, a silicon-based layer and a transparent electroconductive layer are formed at a low temperature of less than 200° C. Accordingly, there is a problem that when a heat treatment is carried out at a high temperature as in Patent Document 1, diffusion of dope impurities from a conductive amorphous silicon-based layer to an intrinsic amorphous silicon-based layer or diffusion of different kinds of elements from a transparent electroconductive layer to a silicon-based layer occurs, so that impurity levels or defect levels are formed, leading to deterioration of conversion efficiency. The heterojunction solar cell has such a tendency that even though a heat treatment is carried out at a low temperature as disclosed in Patent Documents 2 and 3, the conversion characteristics are not enhanced, and the conversion characteristics deteriorate as the heating time is increased. In view of these problems, an object of the present invention is to enhance the conversion characteristics of the heterojunction solar cell.

Means for Solving the Problems

As a result of conducting vigorous studies in view of the above-mentioned problems, the inventors have found that photoelectric conversion characteristics can be enhanced by carrying out a heat treatment under certain conditions after formation of a transparent electroconductive layer in manufacture of a heterojunction-type solar cell.

The present invention relates to a method for manufacturing a crystalline silicon-based photoelectric conversion device which includes an intrinsic silicon-based layer, a p-type silicon-based layer and a transparent electroconductive layer positioned in this order on one surface of a conductive single-crystal silicon substrate; and an intrinsic silicon-based layer, an n-type silicon-based layer and a transparent electroconductive layer positioned in this order on the other surface of the conductive single-crystal silicon substrate. In the present invention, a heat treatment is carried out after at least one of the transparent electroconductive layers is formed. The heat treatment is carried out at a temperature of less than 200° C. under a hydrogen-containing atmosphere.

The p-type silicon-based layer is preferably formed in a thickness of 3 nm to 8 nm. The p-type silicon-based layer is preferably a p-type amorphous silicon-based layer. In one embodiment, as the n-type silicon-based layer, an n-type amorphous silicon-based layer and an n-type microcrystalline silicon-based layer are formed in this order from the second intrinsic silicon-based layer side.

Effects of the Invention

According to the present invention, the conversion characteristics of a heterojunction solar cell are enhanced by carrying out a heat treatment under a hydrogen-containing atmosphere after formation of a transparent electroconductive layer.

DESCRIPTION OF EMBODIMENTS

Figure 1:
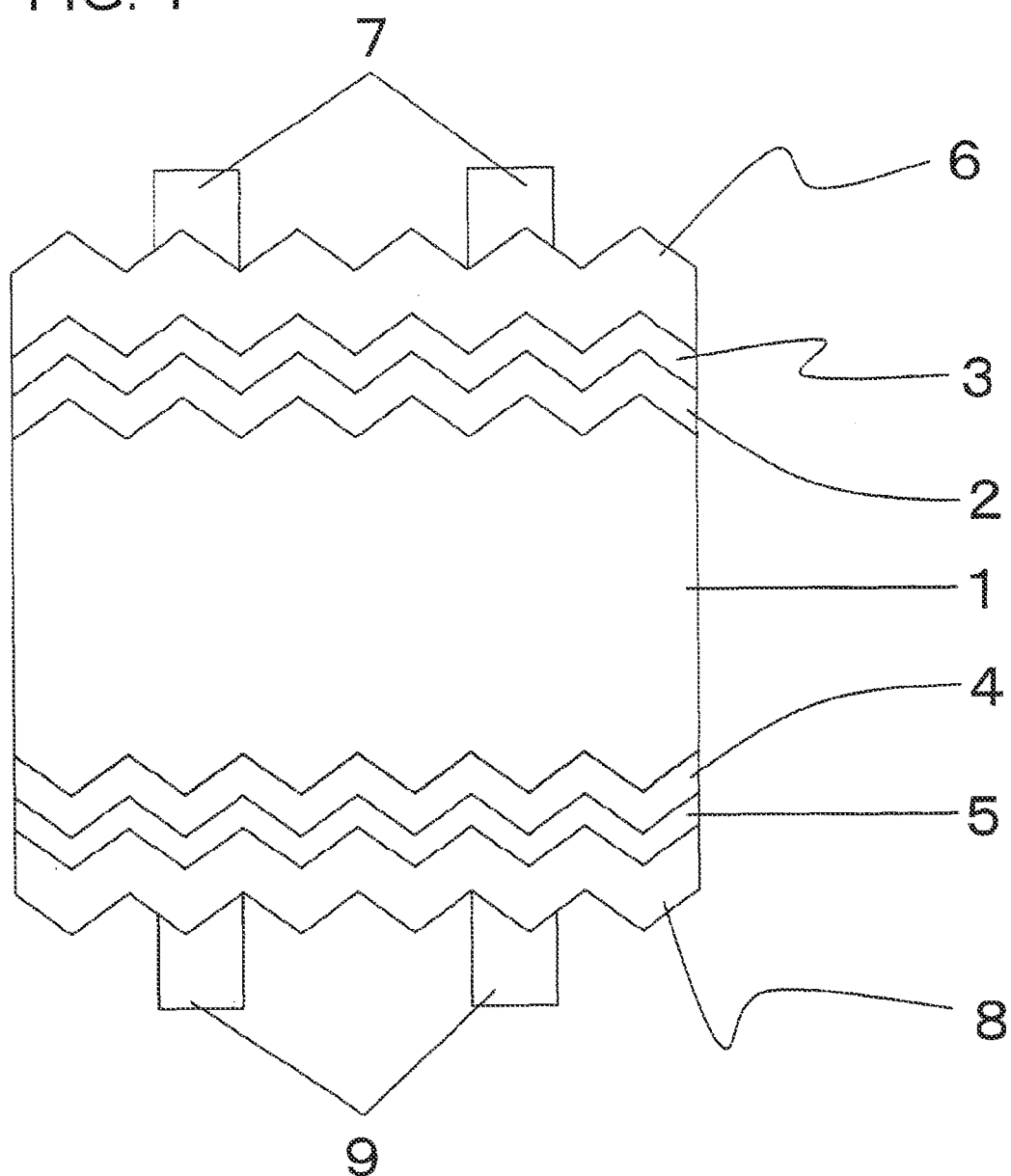
FIG. 1 is a schematic sectional view of a crystalline silicon-based photoelectric conversion device according to one embodiment of the present invention.

An embodiment of the present invention will be described below with reference of the schematic sectional view of a crystalline silicon-based photoelectric conversion device shown in FIG. 1. In the crystalline silicon-based photoelectric conversion device in FIG. 1, a first intrinsic silicon-based layer 2 is formed on one surface of a single-crystal silicon substrate 1 of a first conductivity-type, and a second intrinsic silicon-based layer 4 is formed on the other surface thereof. A p-type silicon-based layer 3 and an n-type silicon-based layer 5 are formed on the surfaces of the first intrinsic silicon-based layer 2 and the second intrinsic silicon-based layer 4, respectively. A first transparent electroconductive layer 6 and a second transparent electroconductive layer 8 are formed on the surfaces of the p-type silicon-based layer 3 and the n-type silicon-based layer 5, respectively. A collecting electrode is formed at least on the transparent electroconductive layer on the light incident side. In FIG. 1, collecting electrodes 7 and 9 are formed on both the light incident side and a back side.

First, the single-crystal silicon substrate 1 of the first conductivity type will be described. Generally, a single-crystal silicon substrate contains an impurity that supplies charges to silicon, and has conductivity. The conductive single-crystal silicon substrates containing an impurity include an n-type single-crystal silicon substrate containing impurity that introduces electrons to Si atoms (e.g. phosphorus atoms), and a p-type single-crystal silicon substrate containing an impurity that introduces holes to Si atoms (e.g. boron atoms). In this specification, "first conductivity type" refers to either an n-type or a p-type.

When the single-crystal silicon substrate of the first conductivity type is used for a solar cell, a heterojunction on the light incident side where light incident to the single-crystal silicon substrate is most absorbed is preferably a reverse junction. When the heterojunction on the light incident side is a reverse junction, a strong electric field is provided, so that electron/hole pairs are effectively separated and collected. When comparing the hole and the electron, the electron, which has a lower effective mass and scattering cross-sectional area, generally has higher mobility. Accordingly, the single-crystal silicon substrate 1 of the first conductivity type used in the present invention is preferably an n-type single-crystal silicon substrate.

An example of the structure of the crystalline silicon-based photoelectric conversion device, when an n-type single-crystal silicon substrate is used as described above, is a structure including a collecting electrode 7 / a transparent electroconductive layer 6 / a p-type silicon-based layer 3 / an intrinsic silicon-based layer 2 / an n-type single-crystal silicon substrate 1 / an intrinsic silicon-based layer 4 / an n-type silicon-based layer 5 / a transparent electroconductive layer 8 / a collecting electrode 9, in this order from light incident side. In this configuration, the n-type silicon-based layer (also referred to as an n-layer) side is preferably a back side. From a viewpoint of light confinement, a texture (uneven structure) is preferably formed on a surface of the single-crystal silicon substrate.

The intrinsic silicon-based layers are formed on the surfaces of the single-crystal silicon substrate 1. A plasma-enhanced CVD method is preferably used for forming the silicon-based layers. Conditions used for forming the silicon-based layers are preferably, for example, as follows: a substrate temperature of 100 to 300° C.; a pressure of 20 to 2600 Pa; and a high-frequency power density of 0.004 to 0.8 W/cm$^2$. A source gas used to form the silicon-based layers may be a silicon-containing gas such as $SiH_4$ or $Si_2H_6$, or a mixed gas of silicon-based gas and $H_2$. A dopant gas for forming the p-layer or n-layer is preferably, for example, $B_2H_6$ or $PH_3$. The amount of impurity such as P or B added, in this case, is sufficient to be a trace amount; thus, a mixed gas wherein a dopant gas is beforehand diluted with the source gas, $H_2$ or the like may be used. A gas containing a different element, such as $CH_4$, $CO_2$, $NH_3$ or $GeH_4$, may be added to the aforementioned gas to form a silicon alloy layer, such as silicon carbide, silicon nitride and silicon germanium, as the silicon-based layer.

The intrinsic silicon-based layers 2 and 4 are non-doped silicon-based thin-films of substantially intrinsic silicon. The intrinsic silicon-based layers 2 and 4 are preferably non-doped hydrogenated amorphous silicon consisting essentially of silicon and hydrogen. When intrinsic silicon-based layers 2 and 4 are formed on each surface of the single-crystal silicon substrate, surface passivation can be effectively performed while suppressing diffusion of impurities to the single-crystal silicon substrate during the deposition of the conductive silicon layer. When the amount of hydrogen in the intrinsic silicon based layer is changed in the thickness direction, the layer may have an energy gap profile effective for collecting carriers.

The thickness of the intrinsic silicon based layers 2 and 4 is preferably in a range of 3 nm to 16 nm, more preferably in a range of 4 nm to 14 nm, further preferably in a range of 5 to 12 nm. If the thickness of the intrinsic silicon-based layer is excessively small, interface defects tends to be increased due to diffusion of impurity atoms in the conductive silicon-based layers 3 and 5 to the single-crystal silicon substrate surface or deterioration of surface coverage of the single-crystal silicon substrate. On the other hand, if the thickness of the intrinsic silicon-based layers is excessively large, the conversion characteristics may be deteriorated due to an increase in resistance or an increase in loss of light by absorption.

The p-type silicon-based layer 3 is formed on the first intrinsic silicon-based layer 2. The p-type silicon-based layer is preferably an amorphous silicon-based layer such as a p-type hydrogenated amorphous silicon layer, a p-type amorphous silicon carbide layer or a p-type oxidized amorphous silicon layer. The amorphous silicon-based layer can be formed at a low power density as compared to a formation of a microcrystalline silicon-based layer, and therefore diffusion of impurity atoms to the single-crystal silicon substrate surface is suppressed. Among the amorphous silicon-based layers, the p-type hydrogenated amorphous silicon layer is preferable from the viewpoints of suppression of impurity diffusion and reduction of series resistance. On the other hand, the p-type amorphous silicon carbide layer or the p-type oxidized amorphous silicon layer is preferable because these wide-gap low-refractive index layers can reduce optical loss.

The thickness of the p-type silicon-based layer 3 is preferably in a range of 3 nm to 50 nm. The conductivity-type layers (p-type silicon-based layer 3 and n-type silicon-based layer 5) are necessary for transport of carriers to a transparent electroconductive layer, and if the thickness thereof is too small, movement of the carriers tends to be limited. On the other hand, if the thickness of the conductive layer is too large, the layer may tend to cause light absorption losses. In a thin-film solar cell having an amorphous silicon-based thin-film or microcrystalline silicon-based thin-film as a photoelectric conversion layer, the p-layer and the n-layer are required to have a thickness of about 15 nm for formation of a diffusion potential. In contrast, in a heterojunction-type solar cell using a crystalline silicon substrate, the thickness of the p-layer and the n-layer required for formation of a diffusion potential is small as compared to the thin-film solar cell. Therefore, in the heterojunction-type solar cell, it is preferable to reduce the thickness of a conductive layer placed on the light incident side in particular. For example, for a heterojunction solar cell using an n-type crystalline silicon substrate and having such a configuration that the p-layer side is the light incident side, the thickness of the p-layer is preferably small. Specifically, the thickness of the p-type silicon-based layer 3 is more preferably 15 nm or less, further preferably 10 nm or less, particularly preferably 8 nm or less.

Figure 2:
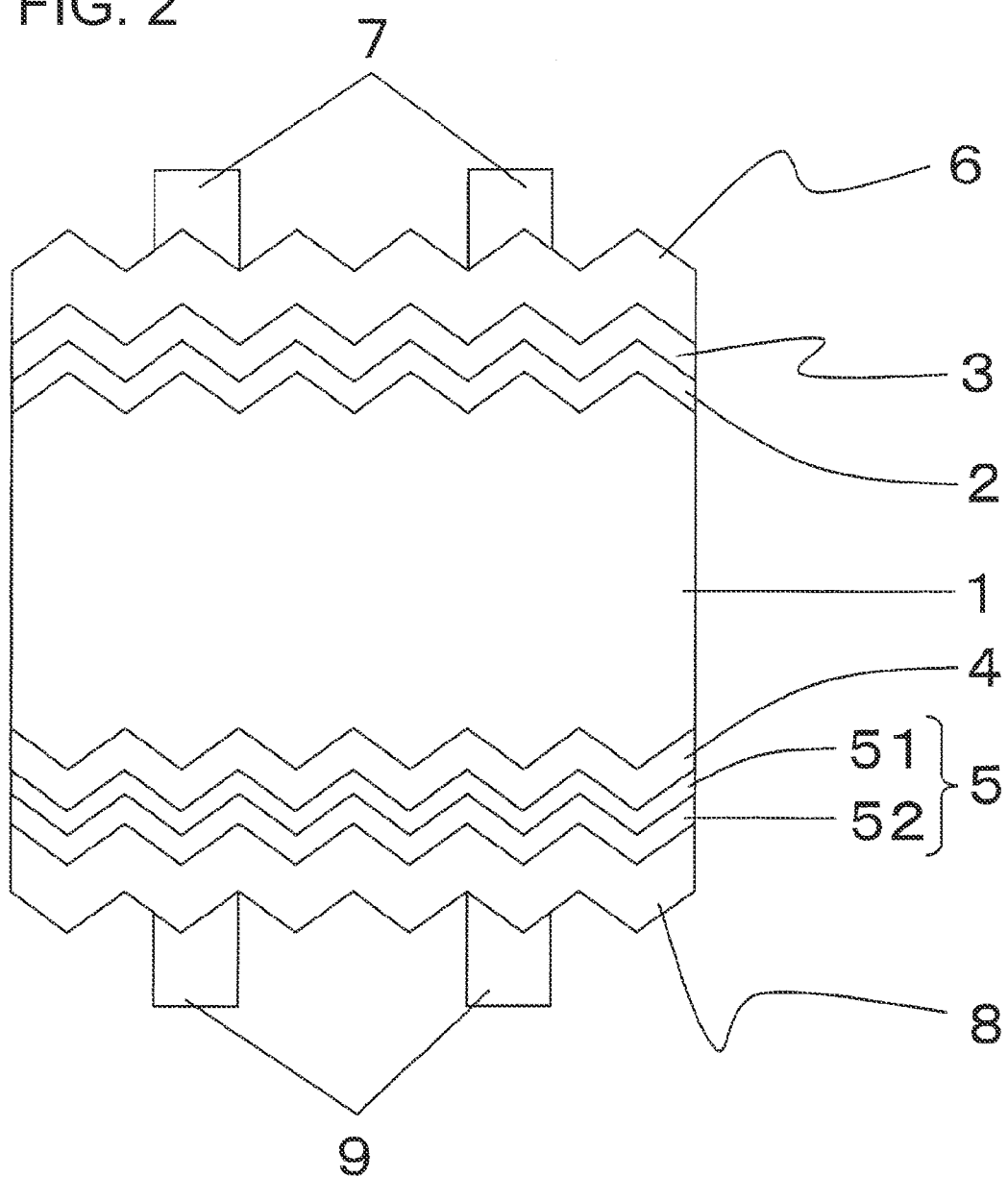
FIG. 2 is a schematic sectional view of a crystalline silicon-based photoelectric conversion device according to one embodiment of the present invention.

The n-type silicon-based layer 5 is formed on the second intrinsic silicon-based layer 4. The n-type silicon-based layer 5 may be composed of a single layer of an n-type amorphous silicon-based layer or an n-type microcrystalline silicon-based layer as shown in FIG. 1, or may be composed of a plurality of layers as shown in FIG. 2. Particularly, it is desirable that the n-type silicon-based layer 5 be composed of two layers: an n-type amorphous silicon-based layer 51 and an n-type microcrystalline silicon-based layer 52 as shown FIG. 2. When the n-type silicon-based layer is an n-type microcrystalline silicon-based layer, there is an advantage that the crystallinity of the transparent electroconductive layer 8 formed thereon can be enhanced, and therefore a good ohmic junction is formed at the interface. On the other hand, in order to form an n-type microcrystalline silicon layer, it is necessary to generate plasma with a high power to generate high-density hydrogen plasma. In contrast, when the n-type amorphous silicon-based layer 51 is formed on the intrinsic silicon-based layer 4, as shown in FIG. 2, in a thickness of about 5 nm to 20 nm, followed by forming thereon the n-type microcrystalline silicon-based layer 52, a power required for formation of the n-type microcrystalline silicon-based layer can be reduced. Therefore, when the n-type silicon-based layer 5 is composed of two layers including the n-type amorphous silicon-based layer 51 and the n-type microcrystalline silicon-based layer 52, diffusion of dope impurities to the intrinsic silicon-based layer 4 and deposition damage are reduced.

The n-type amorphous silicon-based layer is preferably an n-type hydrogenated amorphous silicon layer or an n-type amorphous silicon nitride layer because a good junction characteristic with an adjacent layer is easily obtained. Examples of the n-type microcrystalline silicon-based layer include an n-type microcrystalline silicon layer, an n-type microcrystalline silicon carbide layer and an n-type microcrystalline silicon oxide layer. The n-type microcrystalline silicon layer, in which impurities other than the dope impurity are not aggressively added, is suitably used from the viewpoint of suppressing generation of defects within the n-layer. On the other hand, by using the n-type microcrystalline silicon carbide layer or n-type microcrystalline silicon oxide layer as the n-type microcrystalline silicon-based layer, the effective optical gap can be widened, and the refractive index decreases, so that optical advantages are obtained.

The thickness of the n-type silicon-based layer 5 is preferably in a range of 5 nm to 50 nm. When the n-type silicon-based layer is composed of two layers including the n-type amorphous silicon-based layer 51 and the n-type microcrystalline silicon-based layer 52, as shown in FIG. 2, the thickness of the n-type amorphous silicon-based layer 51 is preferably 5 nm or more, more preferably 10 nm or more. By setting the thickness of the n-type amorphous silicon-based layer 51 in the aforementioned range, the power density during formation of the n-type microcrystalline silicon-based layer 52 thereon can be reduced. The thickness of the n-type microcrystalline silicon-based layer 52 is preferably 5 nm or more, more preferably 10 nm or more. By setting the thickness of the n-type microcrystalline silicon-based layer 52 in the aforementioned range, the crystallinity of the transparent electroconductive layer 8 formed thereon can be enhanced. On the other hand, if the thickness of the n-type amorphous silicon-based layer and the n-type microcrystalline silicon-based layer is excessively large, the conversion characteristics may be deteriorated due to absorption of light by dope impurities. Therefore, the thickness of the n-type amorphous silicon-based layer is preferably 20 nm or less, more preferably 15 nm or less, and the thickness of the n-type microcrystalline silicon-based layer is more preferably 30 nm or less, particularly preferably 20 nm or less.

The first transparent electroconductive layer 6 and the second transparent electroconductive layer 8 are formed on the p-type silicon-based layer 3 and the n-type silicon-based layer 5, respectively. The thickness of the first and the second transparent electroconductive layers are preferably 10 nm or more and 140 nm or less from the viewpoints of transparency and electroconductivity. It suffices that the transparent electroconductive layer has electroconductivity required for transportation of a carrier to the collecting electrode. On the other hand, from the viewpoint of transparency, a too thick transparent electroconductive layer may reduce the transmittance to cause loss due to the absorption by the layer itself, thus leading to deterioration of photoelectric conversion efficiency. As the transparent electroconductive layer, a thin-film formed of a transparent conductive metal oxide, for example, indium oxide, tin oxide, zinc oxide, titanium oxide or a complex oxide thereof is generally used. Particularly, an indium-based complex oxide having indium oxide as a main component is preferable. From the viewpoints of high electroconductivity and transparency, an indium tin complex oxide (ITO) is particularly suitable.

Both the first transparent electroconductive layer and the second transparent electroconductive layer can be formed by a known method. Examples of the formation method include a sputtering method, a metal organic chemical vapor deposition (MOCVD) method, a thermal CVD method, a plasma-enhanced CVD method, a molecular-beam epitaxy (MBE) method and a pulse laser deposition (PLD) method. Particularly, the sputtering method is suitable for formation of an indium-based complex oxide layer of ITO or the like. The substrate temperature during formation of the transparent electroconductive layer may be appropriately set, but is preferably 200° C. or less. If the substrate temperature is higher than the aforementioned range, hydrogen is desorbed from the silicon-based layer, so dangling bonds in the silicon atoms may be generated, giving rise to carrier recombination centers.

The collecting electrodes 7 and 9 for extracting electric current are formed on the transparent electroconductive layers 6 and 8. The collecting electrode can be prepared by a known technique such as inkjet printing, screen printing, wire bonding or spraying. A screen printing is preferable from the viewpoint of productivity. In the screen printing method, a step of printing an electroconductive paste formed of metallic particles and a resin binder by screen printing is suitable.

Figure 3:
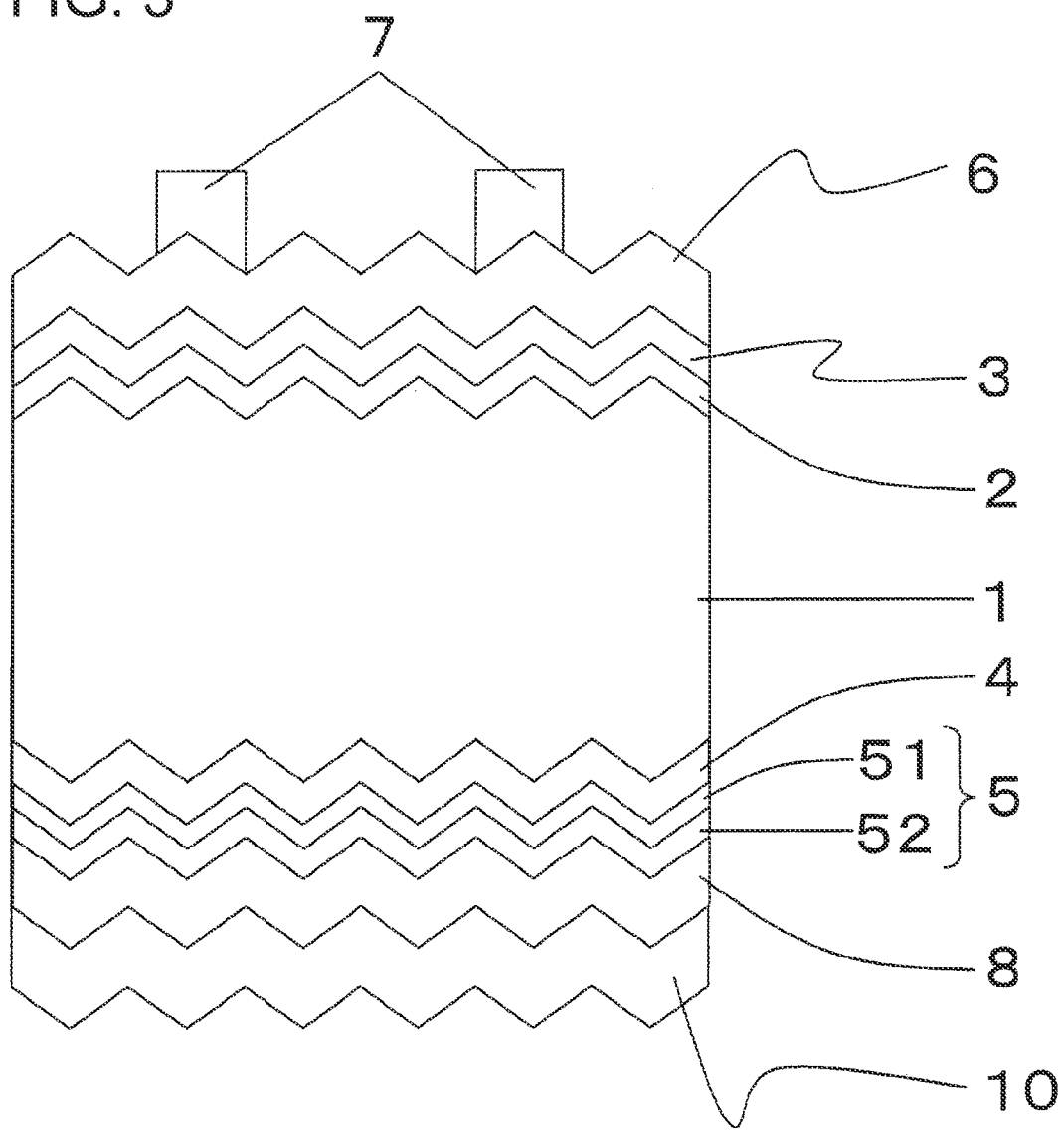
FIG. 3 is a schematic sectional view of a crystalline silicon-based photoelectric conversion device according to one embodiment of the present invention.

At least the collecting electrode on the light incident side is preferably patterned in a shape of a comb-like pattern or the like for increasing the light receiving area of the solar cell. The collecting electrode on a side opposite to the light incident side may or may not be patterned. For example, when a metal electrode 10 on a side opposite to the light incident side is formed substantially over the entire surface of the transparent electroconductive layer as shown in FIG. 3, the metal electrode layer may behave as a reflection layer to prevent light, which has not been absorbed into the silicon substrate, from leaking outside the cell. A metal layer of Ag, At or the like may be formed as a reflection layer between the transparent electroconductive layer and the collecting electrode or the metal electrode layer.

In the present invention, after formation of the transparent electroconductive layer, a heat treatment step is carried out under a hydrogen-containing atmosphere, in the process of manufacturing the photoelectric conversion device. The heat treatment is carried out after formation of the transparent electroconductive layer, so that the conversion characteristics of the photoelectric conversion device, particularly the fill factor, are enhanced. The heat treatment may be carried out after at least one of the first transparent electroconductive layer 6 and the second transparent electroconductive layer 8 is formed. From the viewpoint of enhancing the enhancement of conversion characteristics, it is preferable that the heat treatment be carried out under a hydrogen atmosphere after the first transparent electroconductive layer 6 is formed or after both the first transparent electroconductive layer and the second transparent electroconductive layer are formed.

The heat treatment may be carried out after the collecting electrode and the reflection layer are formed on the transparent electroconductive layer. Also, a heat treatment intended for solidifying an electroconductive paste that is used for the collecting electrode and the reflection electrode may be carried out under a hydrogen-containing atmosphere. In this case, the aforementioned heat treatment under a hydrogen-containing atmosphere can be carried out simultaneously as a heat treatment for formation of an electrode. Consequently, conversion efficiency can be enhanced without providing an additional step.

In the present invention, the heat treatment temperature under a hydrogen-containing atmosphere is less than 200° C. If the heating temperature is too high, diffusion of dope impurities from the conductivity-type silicon-based layers 3 and 5 to the intrinsic silicon-based layers 2 and 4 or diffusion of different kinds of elements from the transparent electroconductive layer to the silicon-based layer may occur, so that impurity levels or defect levels tend to be formed causing deterioration in open circuit voltage and short circuit current density. On the other hand, if the heating temperature is too low, sufficient enhancement of conversion characteristics may not be obtained, or the heat treatment may take a long time. Therefore, the heating temperature is preferably 130° C. or higher, more preferably 150° C. or higher, further preferably 160° C. or higher.

The hydrogen concentration during heat treatment is not particularly limited, but if the hydrogen concentration is too low, a sufficient enhancement of conversion characteristics may not be obtained. If the hydrogen concentration is too high, a conductive oxide that forms the transparent electroconductive layer may be deoxidized, leading to a decrease in transmittance or an increase in series resistance. Therefore, the concentration of hydrogen in the atmosphere in the heat treatment step is preferably 0.1 to 95% by volume, more preferably 0.5 to 80% by volume, further preferably 1 to 45% by volume. Even if the hydrogen concentration falls out of the above-mentioned range, conversion efficiency can also be effectively enhanced by adjusting the heating temperature and the like. In the present invention, a gas composition other than hydrogen in the heat treatment atmosphere is not particularly limited. For safety reasons, it is preferable to use a mixed gas of an inert gas such as nitrogen or argon and hydrogen.

The heat treatment time can be appropriately set according to the hydrogen concentration and the heating temperature described above. The heating time is preferably 5 minutes to 120 minutes, more preferably 20 minutes to 90 minutes, further preferably 30 minutes to 60 minutes, from the viewpoint of improving productivity and conversion characteristics. If the heating time is too short, a sufficient conversion characteristic enhancement by the present invention may not be obtained. If the heating time is too long, productivity becomes poor, and also conversion efficiency may be deteriorated due to deoxidation of a conductive oxide that forms the transparent electroconductive layer.

As is evident from comparison of Examples and Comparative Examples described later, there is no enhancement in photoelectric conversion characteristics when a heat treatment is carried out under a hydrogen-containing atmosphere before formation of the transparent electroconductive layer in a process of manufacturing a heterojunction-type solar cell. It is thus considered that the heat treatment in the present invention does not have an effect of improving the layers of a certain conductivity type by activating dope impurities therein, and so on. Further, in the present invention, both the fill factor and the open circuit voltage tend to be enhanced by the heat treatment. It is generally considered that the open circuit voltage is not enhanced even though the transparent electroconductive layer is made less resistant. Considering the above-described matters, it is assumed that in the present invention, beneficial changes in the interface characteristics brought by the heat treatment contribute to an enhancement of the conversion characteristics.

One factor for improving the interface characteristics may be that oxygen damage during formation of the transparent electroconductive layer is repaired by the heat treatment under a hydrogen-containing atmosphere. For example, when a transparent electroconductive layer formed of ITO is deposited by a sputtering method, an oxygen bond defect (Si—O—Si bond) tends to be generated in hydrogenated silicon at the interface between the conductive silicon-based layer and the transparent electroconductive layer by oxygen plasma during deposition.

The heat treatment of the present invention is not carried out under high energy application conditions as in the hydrogen plasma treatment, or under high-temperature conditions, so that it is considered that a level of energy, which exceeds an activation energy barrier required for terminating dangling bond in hydrogenated silicon at the surface of the silicon-based layer, is not applied. On the other hand, hydrogenated silicon with an oxygen bond defect has a strain in the lattice structure, and therefore the level of activation energy required for repairing a defect such as a dangling bond is low as compared to hydrogenated silicon having no oxygen bond defects. Therefore, it is considered that in the present invention, an oxygen bond defect, a dangling bond adjacent to the oxygen bond defect, and so on are repaired by heating even at a low temperature of less than 200° C., thereby enhancing the conversion characteristics.

In particular, when the thickness of the p-type silicon-based layer is small, the open circuit voltage, in addition to the fill factor, tends to be enhanced by the heat treatment under a hydrogen-containing atmosphere. This is believed to be because when the thickness of the p-layer is small, not only defects generated at the interface between the conductive silicon-based layer and the transparent electroconductive layer but also defects generated at the interface between the conductive silicon-based layer and the intrinsic silicon-based layer are repaired by the heat treatment under a hydrogen-containing atmosphere. That is, when the thickness of the p-layer is small, damage due to oxygen during formation of the transparent electroconductive layer is considered to easily penetrate to the interface between the conductive silicon-based layer and the intrinsic silicon-based layer, but a mechanism is conceived according to which, by heat treatment under a hydrogen-containing atmosphere, a defect generated at the interface is also repaired, leading to enhancement of the open circuit voltage.

Generally, when the thickness of the p-layer of the heterojunction-type solar cell is decreased, enhancement of the short circuit current density due to a reduction of light absorption losses is expected. On the other hand, oxygen damage during formation of the transparent electroconductive layer may penetrate to the interface between the p-layer and the intrinsic silicon-based layer, leading to a decrease in open circuit voltage and fill factor. In contrast, in the present invention, a defect at the interface between the p-layer and the intrinsic silicon-based layer can be repaired by the heat treatment under a hydrogen-containing atmosphere, and therefore both enhancement of the open circuit voltage and the fill factor, and enhancement of the short circuit current density can be achieved. Thus, when the thickness of the p-layer is small, the enhancements in conversion characteristics by the present invention may become more significant, so that a heterojunction-type solar cell having higher conversion characteristics can be obtained.

In the present invention, the heat treatment described above may be carried out in two or more steps. When the heat treatment is carried out in two or more steps, it suffices that at least the heat treatment in one step is carried out under a hydrogen-containing atmosphere.

EXAMPLES

Examples of the present invention will be specifically described below, but the present invention is not limited to the Examples below.

[Measurement Method]

Layer thickness was determined by transmission electron microscope (TEM) observation of cross section. It is difficult to identify the interface between an intrinsic silicon-based layer and a conductive silicon-based layer by TEM observation. Thus, the thickness of each of these layers was calculated from the total thickness of the layers determined from TEM observation and a ratio of their deposition time. For a layer formed on a textured silicon substrate surface, a direction perpendicular to the slope of the texture was determined to be a thickness direction. The output characteristics of a photoelectric conversion device were measured using a solar simulator.

Example 1

In Example 1, a crystalline silicon-based solar cell schematically shown in FIG. 1 was prepared. An n-type single-crystal silicon substrate having a light incident surface direction identical to (100) and having a thickness of 200 μm was washed in acetone. Thereafter, the substrate was immersed in an aqueous HF solution with a concentration of 2% by weight for 3 minutes to remove a silicon oxide covering on the surface, and rinsed twice with ultrapure water. The silicon substrate was immersed in 5/15 wt % aqueous KOH/isopropyl alcohol solution held at 70° C. for 15 minutes, and the surface of the substrate was etched to form a texture thereon. Thereafter, the substrate was rinsed twice with ultrapure water. The surface of the single-crystal substrate 1 was observed using an atomic force microscope (AFM, manufactured by Pacific Nanotechnology, Inc.) to confirm that the substrate surface was mostly etched, and a pyramidal textured surface exposed at the (111) plane was formed.

The single-crystal silicon substrate 1 after being etched was introduced into a CVD device, and a first intrinsic silicon layer 2 was formed with a thickness of 5 nm on one surface of the substrate (incident surface side). Deposition conditions included a substrate temperature of 150° C., a pressure of 120 Pa, a $SiH_4/H_2$ flow ratio of 3/10 and a high-frequency power density of 0.011 $W/cm^2$. On the first intrinsic silicon layer 2, a p-type amorphous silicon layer 3 was formed with a thickness of 10 nm. Deposition conditions of the p-type amorphous silicon layer 3 included a substrate temperature of 150° C., a pressure of 60 Pa, a $SiH_4$/diluted $B_2H_6$ gas flow ratio of 1/3 and a high-frequency power density of 0.011 $W/cm^2$. A diluted gas, wherein $B_2H_6$ concentration was diluted to 5000 ppm with $H_2$, was used as the diluted $B_2H_6$ gas.

On the other surface (back side) of the single-crystal silicon substrate 1, a second intrinsic amorphous silicon layer 4 was formed with a thickness of 5 nm. Deposition conditions of the second intrinsic amorphous silicon layer 4 were identical to those of the first intrinsic amorphous silicon layer 2. On the second intrinsic amorphous silicon layer 4, an n-type amorphous silicon layer 5 was formed with a thickness of 10 nm. Deposition conditions of the n-type amorphous silicon layer 5 included a substrate temperature of 150° C., a pressure of 60 Pa, a $SiH_4$/diluted $PH_3$ gas flow ratio of 1/2 and a high-frequency power density of 0.011 $W/cm^2$. A diluted gas, wherein $PH_3$ concentration was diluted to 5000 ppm with $H_2$, was used as the diluted $PH_3$ gas.

Indium-tin complex oxide (ITO) layers each having a thickness of 100 nm were formed as a first transparent electroconductive layer 6 and a second transparent electroconductive layer 8 on the surfaces of the p-type amorphous silicon layer 3 and the n-type amorphous silicon layer 5, respectively. For the deposition of ITO, a complex sintered compact of an indium oxide and a tin oxide (containing 5% by weight of tin oxide) was used as a target. Argon was introduced at 100 sccm as a carrier gas, and deposition was carried out under conditions including a substrate temperature of an ambient temperature, a pressure of 0.2 Pa and a high-frequency power density of 0.5 $W/cm^2$.

On the surfaces of the transparent electroconductive layers 6 and 8, a silver paste was screen-printed as collecting electrodes 7 and 9, respectively. Thereafter, a heat treatment was carried out at 150° C. under an atmospheric pressure for 60 minutes to solidify the silver paste, so that comb-like pattern collecting electrodes were formed. The interval between the collecting electrodes was set at 10 mm.

After the collecting electrodes were formed, a heat treatment was carried out at a temperature of 170° C. for 60 minutes under an atmosphere containing 2% of hydrogen.

Examples 2 to 5

A solar cell was prepared in the same manner as in Example 1 except that the hydrogen content during the heat treatment and the heat treatment time were changed as shown in Table 1.

Comparative Example 1

A solar cell was prepared in the same manner as in Example 1 except that a heat treatment under a hydrogen-containing atmosphere was not carried out.

The results of evaluating the photoelectric conversion characteristics of the solar cells of Examples and Comparative Example by using a solar simulator are shown in Table 1. In Table 1, values normalized with Comparative Example 1 as a reference are shown in addition to measured values of the photoelectric conversion characteristics (open circuit voltage, short circuit current density, fill factor and conversion efficiency).

Comparative Example 3

In Comparative Example 3, a solar cell was prepared in the same manner as in Comparative Example 1, but Comparative Example 3 was prepared using a different manufacturing method from Comparative Example 1 in that the heat treatment was carried out under an air atmosphere at 150° C.

Example 7

In Example 7, a solar cell was prepared in the same manner as in Example 1. In Example 7, a heat treatment was carried out at a temperature of 170° C. for 60 minutes under an atmosphere containing 25% of hydrogen after the first transparent electroconductive layer 6 and the second transparent electroconductive layer 8 were formed and before the silver paste was screen-printed, and a heat treatment under a hydrogen-containing atmosphere was not carried out after formation of the collecting electrode. Otherwise, a solar cell was prepared in the same manner as in Example 1.

TABLE 1

|  | heat treatment conditions | | | measured value | | | | normalized value | | | |
| --- | --- | --- | --- | --- | --- | --- | --- | --- | --- | --- | --- |
|  | hydrogen concentration vol. % | temp- erature ° C. | time min. | open vol- tage V | short circuit current mA/cm² | fill factor % | conversion efficiency % | open vol- tage — | short circuit current — | fill factor — | conversion efficiency — |
| Example 1 | 2 | 170 | 60 | 0.707 | 35.10 | 74.4 | 18.46 | 0.999 | 1.001 | 1.021 | 1.020 |
| Example 2 | 25 | 170 | 60 | 0.706 | 35.00 | 77.2 | 19.08 | 0.997 | 0.998 | 1.059 | 1.054 |
| Example 3 | 40 | 170 | 60 | 0.708 | 34.20 | 77.8 | 18.84 | 1.000 | 0.975 | 1.067 | 1.040 |
| Example 4 | 50 | 170 | 10 | 0.708 | 34.22 | 76.3 | 18.49 | 1.000 | 0.975 | 1.047 | 1.021 |
| Example 5 | 80 | 170 | 10 | 0.707 | 33.80 | 77.2 | 18.45 | 0.999 | 0.964 | 1.059 | 1.019 |
| Comparative Example 1 |  |  |  | 0.708 | 35.08 | 72.9 | 18.11 | 1 | 1 | 1 | 1 |

Example 6 and Comparative Example 2

A solar cell was prepared in the same manner as in Example 1 except that the heat treatment temperature was changed as shown in Table 2. The results of evaluating the photoelectric conversion characteristics of the solar cells by using a solar simulator are shown in Table 2 along with the results of Comparative Example 1 and Example 2. In Table 2, values normalized with Comparative Example 1 as a reference are shown in addition to measured values of the photoelectric conversion characteristics.

Comparative Example 4

In Comparative Example 4, a solar cell was prepared in the same manner as in Comparative Example 1, but Comparative Example 4 was prepared using a different manufacturing method from Comparative Example 1 in that a heat treatment was carried out at 170° C. for 60 minutes under an atmosphere containing 25% of hydrogen after each amorphous silicon-based layer was formed and before the transparent electroconductive layer was formed. In Comparative Example 4, a

TABLE 2

|  | heat treatment conditions | | | measured value | | | | normalized value | | | |
| --- | --- | --- | --- | --- | --- | --- | --- | --- | --- | --- | --- |
|  | hydrogen concentration vol. % | temp- erature ° C. | time min. | open vol- tage V | short circuit current mA/cm² | fill factor % | conversion efficiency % | open vol- tage — | short circuit current — | fill factor — | conversion efficiency — |
| Comparative Example 1 |  |  |  | 0.708 | 35.08 | 72.9 | 18.11 | 1 | 1 | 1 | 1 |
| Example 2 | 25 | 170 | 60 | 0.706 | 35.00 | 77.2 | 19.08 | 0.997 | 0.998 | 1.059 | 1.054 |
| Example 6 | 25 | 190 | 60 | 0.707 | 34.99 | 74.1 | 18.34 | 0.999 | 0.998 | 1.017 | 1.013 |
| Comparative Example 2 | 25 | 210 | 60 | 0.692 | 33.58 | 76.1 | 17.68 | 0.978 | 0.957 | 1.043 | 0.977 | heat treatment under a hydrogen-containing atmosphere was not carried out after formation of the collecting electrode.

The results of evaluating the photoelectric conversion characteristics of the solar cells of Example 7 and Comparative Examples 3 and 4 by using a solar simulator are shown in Table 3. In Table 3, conversion characteristic values normalized with the measured values of Comparative Example 3 as a reference are shown.

TABLE 3

| | Timing of the heat treatment under hydrogen-containing atmosphere | conversion characteristics | | | |
|---|---|---|---|---|---|
| | | open voltage | short circuit current | fill factor | conversion efficiency |
| Example 7 | before forming Ag electrode | 1.006 | 0.995 | 1.024 | 1.025 |
| Comparative Example 3 | no heat treatment | 1 | 1 | 1 | 1 |
| Comparative Example 4 | before forming ITO film | 0.999 | 0.995 | 1.010 | 1.004 |

From comparison of Examples 1 to 5 and Comparative Example 1 in Table 1, it is apparent that by carrying out a heat treatment under a hydrogen-containing atmosphere, the fill factor is improved, and therefore the conversion efficiency is enhanced. From comparison of Example 1 and Examples 4 and 5, it is apparent that under a high-concentration hydrogen atmosphere, the conversion characteristic is enhanced by short-time heating.

According to Table 2, in Comparative Example 2 in which the temperature during heat treatment is higher than 200° C., the fill factor is enhanced, but the conversion efficiency is deteriorated in association with a decrease in short circuit current density and open circuit voltage. This is considered to be because diffusion of dope impurities from the conductive amorphous silicon layer to the intrinsic silicon-based layer, diffusion of different kinds of elements from the transparent electroconductive layer to the silicon-based layer, or the like occurs due to a heat treatment at a high temperature.

According to Table 3, in Comparative Example 4 in which a heat treatment is carried out under a hydrogen-containing atmosphere before formation of the transparent electrode layer, the conversion efficiency is not changed as compared to Comparative Example 3. In contrast, in Example 7 in which a heat treatment is carried out under a hydrogen-containing atmosphere after formation of the transparent electrode layer, the conversion efficiency is enhanced as the fill factor is improved as in Examples 1 to 6 described above. It is thus apparent that for enhancement of the conversion efficiency, it is important to carry out a heat treatment under a hydrogen-containing atmosphere after formation of the transparent electroconductive layer.

Example 8

In Example 8, a crystalline silicon-based photoelectric conversion device schematically shown in FIG. 3 was manufactured.

As in Example 1, the single-crystal silicon substrate 1, which had been etched, was introduced into a CVD device, and the first intrinsic amorphous silicon layer 2 was formed on one surface (incident surface side) with a thickness of 5 nm. On the first intrinsic silicon layer 2, a p-type amorphous silicon layer 3 was formed with a thickness of 10 nm. Deposition conditions of the first intrinsic amorphous silicon layer and the p-type amorphous silicon layer were identical to those in Example 1.

On the other surface (back side) of the single-crystal silicon substrate 1, a second intrinsic amorphous silicon layer 4 was formed with a thickness of 5 nm, in the same manner as in Example 1. On the second intrinsic amorphous silicon layer 4, an n-type amorphous silicon layer 51 was formed with a thickness of 10 nm. Deposition conditions of the second intrinsic amorphous silicon layer and the n-type amorphous silicon layer were identical to those in Example 1.

On the n-type amorphous silicon layer 51, an n-type microcrystalline silicon layer 52 was formed with a thickness of 20 nm. Deposition conditions of the n-type microcrystalline silicon layer included a substrate temperature of 150° C., a pressure of 100 Pa, a $SiH_4$/diluted $PH_3$ gas flow ratio of 1/5 and a high-frequency power density of 0.01 W/cm². A diluted gas, wherein $PH_3$ concentration was diluted to 5000 ppm with $H_2$, was used as the diluted $PH_3$ gas.

The ITO transparent electroconductive layers 6 and 8 were formed with a thickness of 100 nm on the p-type amorphous silicon layer 3 and the n-type microcrystalline silicon layer 52, respectively, in the same manner as in Example 1. On the surface of the transparent electroconductive layer 6 on the light incident side, a silver paste was screen-printed in the same manner as in Example 1, and a heat treatment was carried out under an air atmosphere at 150° C. for 60 minutes, so that the collecting electrode 7 was formed. On the transparent electroconductive layer 8 on the back side, a silver paste was applied over the entire surface without carrying out patterning, and drying was conducted in the same manner, so that the metal electrode 10 was formed.

After the formation of the electrodes, a heat treatment was carried out at a temperature of 190° C. for 30 minutes under an atmosphere containing 25% of hydrogen.

Comparative Example 5

A solar cell was prepared in the same manner as in Example 8 except that a heat treatment under a hydrogen-containing atmosphere was not carried out.

Example 9

A solar cell was prepared in the same manner as in Example 8 except that the thickness of the p-type amorphous silicon layer was changed to 5 nm.

Comparative Example 6

A solar cell was prepared in the same manner as in Example 8 except that a heat treatment under a hydrogen-containing atmosphere was not carried out.

The results of evaluating the photoelectric conversion characteristics of the solar cells of Examples 8 and 9 and Comparative Examples 5 and 6 by using a solar simulator are shown in Table 4.

TABLE 4

| | thickness of conductive silicon-based layer | | | heat treatment under hydrogen containing-atmosphere | open voltage V | short circuit current mA/cm$^2$ | fill factor % | conversion efficiency % |
|---|---|---|---|---|---|---|---|---|
| | p-type a-Si | n-type a-Si | n-type μc-Si | | | | | |
| Example 8 | 10 | 10 | 20 | yes | 0.706 | 35.00 | 77.2 | 19.08 |
| Comparative Example 5 | 10 | 10 | 20 | no | 0.708 | 35.08 | 72.9 | 18.11 |
| Example 9 | 5 | 10 | 20 | yes | 0.717 | 35.50 | 77.5 | 19.73 |
| Comparative Example 6 | 5 | 10 | 20 | no | 0.706 | 35.56 | 73.6 | 18.48 |

As is evident from comparison of Example 8 and Comparative Example 5 and comparison of Example 9 and Comparative Example 6, it is apparent that by carrying out a heat treatment under a hydrogen-containing atmosphere, the fill factor is improved, so that the conversion efficiency is enhanced, in such a configuration that the n-type silicon-based layer is composed of two layers: an amorphous silicon layer and a microcrystalline silicon layer, as well.

When comparing Example 9 and Comparative Example 6 both having the p-type amorphous silicon-layer with a thickness of 5 nm, the fill factor is enhanced by about 5%, and the open circuit voltage is also enhanced by about 2% in Example 9. That is, it is apparent that when the thickness of the p-layer is small, the improvement of the conversion efficiency improving by the heat treatment under a hydrogen-containing atmosphere is more significant.

Examples 10 to 17 and Comparative Example 7

A solar cell was prepared in the same manner as in Example 9 except that the hydrogen content, the temperature and the time of the heat treatment were changed as shown in Table 5.

Comparative Example 8

A solar cell was prepared in the same manner as in Example 9 except that a heat treatment under a hydrogen-containing atmosphere was not carried out.

Comparative Example 9

A solar cell was prepared in the same manner as in Example 9 except that a heat treatment was carried out for 30 minutes under an air atmosphere at a temperature of 190° C. instead of carrying out a heat treatment under a hydrogen-containing atmosphere, after formation of the electrode.

The results of evaluating the photoelectric conversion characteristics of the solar cells of Examples 10 to 17 and Comparative Examples 8 and 9 by using a solar simulator are shown in Table 5. In Table 5, conversion characteristic values normalized with the measured values of Comparative Example 8 as a reference are shown.

TABLE 5

| | heat treatment conditions | | | conversion characteristics | | | |
|---|---|---|---|---|---|---|---|
| | hydrogen concentration vol. % | temperature ° C. | time min. | open voltage — | short circuit current — | fill factor — | conversion efficiency — |
| Example 10 | 0.5 | 190 | 30 | 1.004 | 1.000 | 1.016 | 1.021 |
| Example 11 | 2 | 190 | 30 | 1.011 | 0.998 | 1.022 | 1.032 |
| Example 12 | 25 | 190 | 30 | 1.016 | 0.998 | 1.053 | 1.068 |
| Example 13 | 40 | 190 | 30 | 1.016 | 0.985 | 1.054 | 1.055 |
| Example 14 | 25 | 150 | 30 | 1.010 | 0.999 | 1.010 | 1.019 |
| Example 15 | 25 | 170 | 30 | 1.012 | 0.998 | 1.030 | 1.041 |
| Comparative Example 7 | 25 | 210 | 30 | 1.015 | 0.940 | 1.040 | 0.992 |
| Example 16 | 50 | 190 | 10 | 1.013 | 0.989 | 1.038 | 1.040 |
| Example 17 | 80 | 190 | 10 | 1.013 | 0.987 | 1.043 | 1.043 |
| Comparative Example 8 | | | | 1 | 1 | 1 | 1 |
| Comparative Example 9 | 0 | 190 | 30 | 1.001 | 0.999 | 1.003 | 1.003 |

In Examples 10 to 17 in which a heat treatment is carried out under a hydrogen-containing atmosphere, the fill factor and the open circuit voltage are improved, and resultantly the conversion efficiency is enhanced as compared to Comparative Example 8. In Examples 12 to 17 described above, the open circuit voltage is improved by 1% (about 7 mV) or more as compared to Comparative Example 8.

A method has been known in which a transparent electrode is made less resistant by carrying out a heat treatment under an air atmosphere in a step of manufacturing a solar cell, but it is considered that the open circuit voltage is not improved by making the transparent electrode less resistant. When considering these results, it is believed that the conversion efficiency is enhanced because a defect generated at the interface is repaired by the heat treatment under a hydrogen-containing atmosphere in the present invention.

On the other hand, the conversion characteristic in Comparative Example 9, in which heating is carried out at 190° C. for 30 minutes under an air atmosphere containing no hydrogen (hydrogen concentration 0%), was comparable to that in Comparative Example 8. In contrast, in Example 10 in which a heat treatment is carried out at 190° C. for 30 minutes under an atmosphere having a hydrogen concentration of 0.5% by volume, the conversion characteristic is enhanced principally by improvement of the fill factor.

In Example 17 in which a heat treatment is carried out at a hydrogen concentration of 80% for 10 minutes, the short circuit current density decreases, but the fill factor and the open circuit voltage improving effect are great, so that the conversion characteristic is enhanced as compared to Comparative Example 8. From these results, it is apparent that by carrying out a short-time heat treatment under an atmosphere having a high hydrogen concentration, the fill factor is improved while a decrease in short circuit current density resulting from reduction of the transparent electroconductive layer is suppressed, so that the conversion characteristic can be efficiently enhanced.

DESCRIPTION OF REFERENCE CHARACTERS

1: single-crystal silicon substrate of first conductivity type
2, 4: intrinsic silicon-based layer
3: p-type silicon-based layer
5: n-type silicon-based layer
51: n-type amorphous silicon-based layer
52: n-type microcrystalline silicon-based layer
6, 8: transparent electroconductive layer
7, 9: correcting electrode
10: reflection electrode

The invention claimed is:

1. A method for manufacturing a crystalline silicon-based photoelectric conversion device, comprising:
   forming a first intrinsic silicon-based layer, a p-type silicon-based layer and a first transparent electroconductive layer, in this order on one surface of a single-crystal silicon substrate of a first conductivity type;
   forming a second intrinsic silicon-based layer, an n-type silicon-based layer and a second transparent electroconductive layer, in this order on the other surface of the single-crystal silicon substrate of the first conductivity type; and
   carrying out a heat treatment after at least one of the first transparent electroconductive layer and the second transparent electroconductive layer is formed;
   wherein the first transparent electroconductive layer and the second transparent electroconductive layer are indium tin oxide layers each formed by a sputtering method, and the heat treatment is carried out at a temperature of less than 200° C. under a hydrogen-containing atmosphere.

2. The method for manufacturing the crystalline silicon-based photoelectric conversion device according to claim 1, wherein forming the p-type silicon-based layer includes forming the p-type silicon-based layer to have a thickness of 3 nm to 8 nm.

3. The method for manufacturing the crystalline silicon-based photoelectric conversion device according to claim 1, wherein forming the n-type silicon-based layer includes forming the n-type silicon-based layer to include an n-type amorphous silicon-based layer and an n-type microcrystalline silicon-based layer, positioned in this order from the second intrinsic silicon-based layer side.

4. The method for manufacturing the crystalline silicon-based photoelectric conversion device according to claim 1, wherein the heat treatment is carried out after both the first transparent electroconductive layer and the second transparent electroconductive layer are formed.

5. The method for manufacturing the crystalline silicon-based photoelectric conversion device according to claim 1, wherein after the first intrinsic silicon-based layer, the second intrinsic silicon-based layer, the p-type silicon-based layer, and the n-type silicon-based layer are formed, then at least one of the first transparent electroconductive layer and the second transparent electroconductive layer is formed, and then the heat treatment is carried out.

* * * * *